(12) United States Patent
Yang

(10) Patent No.: US 11,765,883 B2
(45) Date of Patent: Sep. 19, 2023

(54) METHOD FOR MANUFACTURING SEMICONDUCTOR DIE WITH DECOUPLING CAPACITOR

(71) Applicant: NANYA TECHNOLOGY CORPORATION, New Taipei (TW)

(72) Inventor: Wu-Der Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/685,535

(22) Filed: Mar. 3, 2022

(65) Prior Publication Data
US 2022/0189959 A1 Jun. 16, 2022

Related U.S. Application Data

(62) Division of application No. 17/031,477, filed on Sep. 24, 2020, now Pat. No. 11,508,729.

(51) Int. Cl.
*H01L 27/108* (2006.01)
*H01L 49/02* (2006.01)
(Continued)

(52) U.S. Cl.
CPC .............. *H10B 12/30* (2023.02); *H01L 24/05* (2013.01); *H01L 27/0805* (2013.01); *H01L 28/60* (2013.01)

(58) Field of Classification Search
CPC ......... H01L 27/0805; H01L 27/10805–10841; H01L 27/1085–1087; H01L 27/101;
(Continued)

(56) References Cited

U.S. PATENT DOCUMENTS

| 6,337,824 B1* | 1/2002 | Kono ................... G11C 11/4091 365/207 |
| 2006/0289932 A1* | 12/2006 | Ahn ..................... H01L 27/0207 257/334 |
| 2010/0219502 A1* | 9/2010 | Shieh ..................... H01L 28/40 257/532 |

FOREIGN PATENT DOCUMENTS

| TW | 201344868 A | 11/2013 |
| TW | 201438149 A | 10/2014 |
(Continued)

OTHER PUBLICATIONS

Office Action dated Apr. 18, 2022 related to Taiwanese Application No. 1101242160.
(Continued)

*Primary Examiner* — Victor A Mandala
*Assistant Examiner* — Lawrence C Tynes, Jr.
(74) *Attorney, Agent, or Firm* — Xuan Zhang

(57) ABSTRACT

The present application provides a method for manufacturing a semiconductor die. The method includes forming dielectric layers on a substrate; forming decoupling capacitors in the dielectric layers; forming first and second bonding pads on the dielectric layers, wherein the first bonding pads are coupled to a power supply voltage, the second bonding pads are coupled to a reference voltage, a group of the decoupling capacitors are located under one of the first bonding pads, first terminals of the group of the decoupling capacitors are electrically connected to the one of the first bonding pads, second terminals of the group of the decoupling capacitors are routed to one of the second bonding pads; and forming bond metals on the first and second bonding pads, wherein the decoupling capacitors are overlapped with the first and second bonding pads, and laterally surround portions of the dielectric layers overlapped with the bond metals.

9 Claims, 21 Drawing Sheets

(51) Int. Cl.
  *H01L 27/08* (2006.01)
  *H01L 23/00* (2006.01)
  *H10B 12/00* (2023.01)

(58) Field of Classification Search
  CPC .... H01L 27/0802–0811; H01L 27/0772–0794; H01L 27/0755; H01L 27/0711–0738; H01L 27/067–0682; H01L 27/0647–0658; H01L 27/0629–0635; H01L 27/0288; H01L 27/10811; H01L 27/10814; H01L 27/1082; H01L 27/10847; H01L 27/11273–1128; H01L 27/11514; H01L 27/11551; H01L 27/11578–11582; H01L 27/11597; H01L 27/2481–249; H01L 27/108–10897; H01L 27/1023; H01L 24/05; H01L 24/00–98; H01L 28/40–92; H01L 2924/1205; H01L 2924/19041; H01L 2924/1436–14369; H01L 2224/00–98; H01G 4/00–40; G11C 11/401–4099; G11C 14/0009–0045; G11C 2211/4016; H10B 12/30–373
  See application file for complete search history.

(56) References Cited

FOREIGN PATENT DOCUMENTS

| | | |
|---|---|---|
| TW | 201737420 A | 10/2017 |
| TW | 201822343 A | 6/2018 |
| TW | 201924021 A | 6/2019 |
| TW | 202022880 A | 6/2020 |
| TW | 202034318 A | 9/2020 |
| TW | 202034529 A | 9/2020 |

OTHER PUBLICATIONS

Summary translation of Office Action dated Apr. 18, 2022 related to Taiwanese Application No. 110124260.

* cited by examiner

METHOD FOR MANUFACTURING SEMICONDUCTOR DIE WITH DECOUPLING CAPACITOR

CROSS-REFERENCE TO RELATED APPLICATION

This application is a divisional application of U.S. Non-Provisional application Ser. No. 17/031,477 filed Sep. 24, 2020, which is incorporated herein by reference in its entirety.

TECHNICAL FIELD

The present disclosure relates to a method for manufacturing a semiconductor die, and more particularly, to a method for manufacturing a semiconductor die with decoupling capacitors.

DISCUSSION OF THE BACKGROUND

The semiconductor industry has experienced rapid growth in the past decades. Along with advances in material and manufacturing techniques, progress of integrated circuit during the past decades also includes continuously scaling of feature size and using faster clock frequency. Problems come along with high clock frequency may include power supply oscillation, which may result in noise that is generated and transmitted across the chip.

For instance, charges stored in cells of a dynamic random access memory (DRAM) may vary as a result of the power supply oscillation, thus data stored in the cells may be misread. Further, such DRAM malfunction becomes more significant when operation voltage of the DRAM is reduced (e.g., to 1.0V or less) for portable electronic and/or communication equipment.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In an aspect of the present disclosure, a semiconductor die is provided. The semiconductor die comprises: a memory array, disposed within a cell region of the semiconductor die; first and second bonding pads, disposed within an input/output (I/O) region of the semiconductor die, wherein the first bonding pads are coupled to a power supply voltage, and the second bonding pads are coupled to a reference voltage; decoupling capacitors, disposed under the first and second bonding pads, and connected in parallel between the first bonding pads and the second bonding pads; and bond metals, disposed on the first and second bonding pads, respectively, wherein the decoupling capacitors are overlapped with the first and second bonding pads, and are located outside portions of the semiconductor die that are overlapped with the bond metals.

In another aspect of the present disclosure, a semiconductor die is provided. The semiconductor die comprises: dielectric layers, stacked on a substrate; decoupling capacitors, formed in the dielectric layers; first and second bonding pads, disposed on the dielectric layers, wherein the first bonding pads are coupled to a power supply voltage, the second bonding pads are coupled to a reference voltage, a group of the decoupling capacitors are located under one of the first bonding pads, first terminals of the group of the decoupling capacitors are electrically connected to the one of the first bonding pads, second terminals of the group of the decoupling capacitors are routed to one of the second bonding pads; and bond metals, disposed on the first and second bonding pads, wherein the decoupling capacitors are overlapped with the first and second bonding pads, and laterally surround portions of the dielectric layers overlapped with the bond metals.

In yet another aspect of the present disclosure, a semiconductor die is provided. The semiconductor die comprises: first and second bonding pads, wherein the first bonding pads are coupled to a power supply voltage, and the second bonding pads are coupled to a reference voltage; bond metals, disposed on central portions of the first and second bonding pads, respectively; and decoupling capacitors, disposed under the first and second bonding pads, and overlapped with peripheral portions of the first and second bonding pads, wherein the decoupling capacitors are in parallel connection with one another, first terminals of the decoupling capacitors are electrically connected to the first bonding pads, and second terminals of the decoupling capacitors are electrically connected to the second bonding pads.

The present application further provides a method for manufacturing a semiconductor die with decoupling capacitors. The method includes forming dielectric layers on a substrate; forming decoupling capacitors in the dielectric layers; forming first and second bonding pads on the dielectric layers, wherein the first bonding pads are coupled to a power supply voltage, the second bonding pads are coupled to a reference voltage, a group of the decoupling capacitors are located under one of the first bonding pads, first terminals of the group of the decoupling capacitors are electrically connected to the one of the first bonding pads, second terminals of the group of the decoupling capacitors are routed to one of the second bonding pads; and forming bond metals on the first and second bonding pads, wherein the decoupling capacitors are overlapped with the first and second bonding pads, and laterally surround portions of the dielectric layers overlapped with the bond metals.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
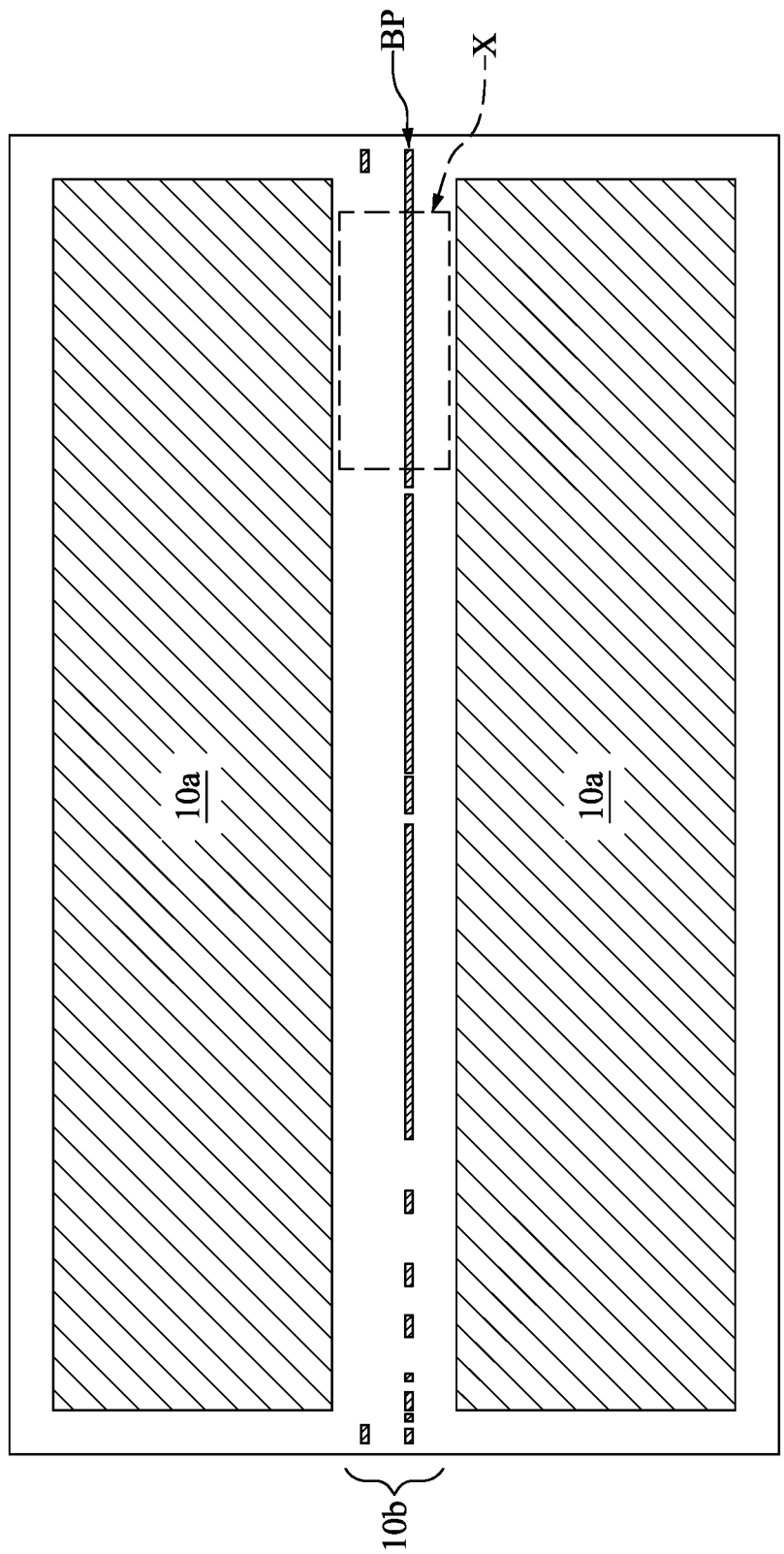
FIG. 1A is a schematic plan view illustrating a method of some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
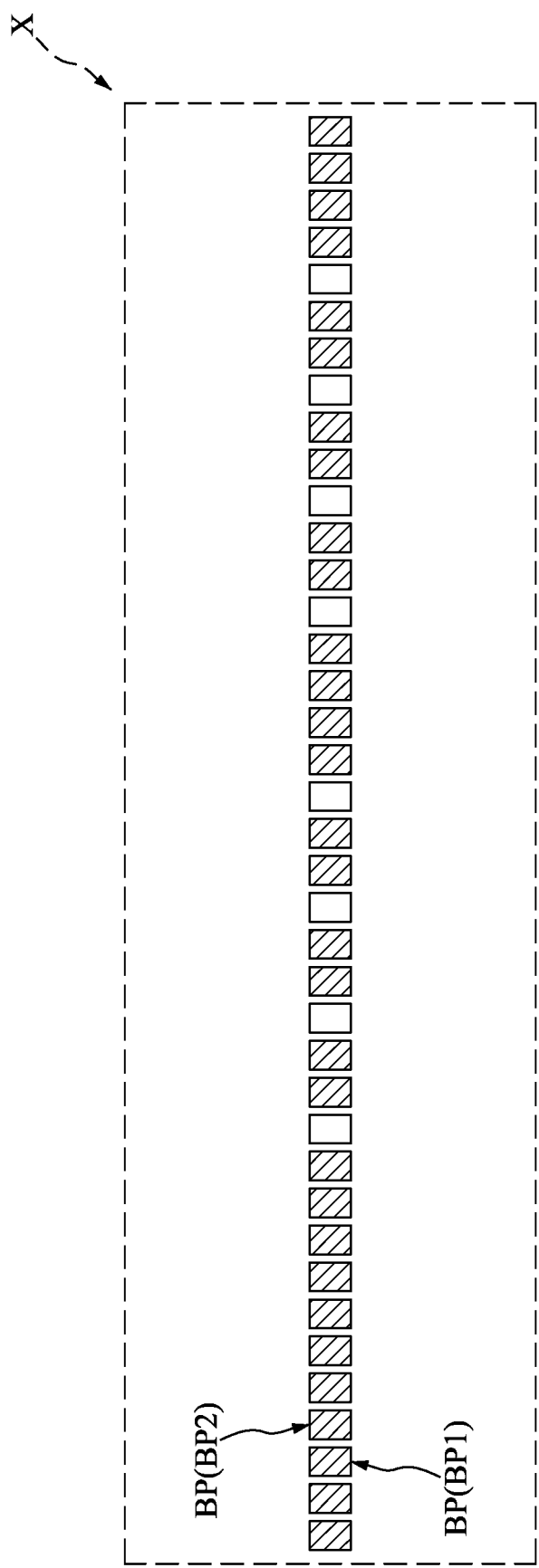
FIG. 1B is an enlarged view illustrating a region X shown in FIG. 1A.

FIG. 1A is a schematic plan view illustrating a semiconductor die 10 according to some embodiments of the present disclosure. FIG. 1B is an enlarged view illustrating a region X shown in FIG. 1A.

Referring to FIG. 1A, the semiconductor die 10 may be a memory die. In some embodiments, the semiconductor die 10 is a dynamic random access memory (DRAM) die. For instance, the DRAM die may be a first, second, third or fourth generation double date rate (i.e., DDR1, DDR2, DDR3 or DDR4) DRAM die. Further, the double date rate (DDR) DRAM die may be designed for operating under low power supply, and may be referred as a low power DDR (LPDDR) DRAM die, such as a LPDDR4 DRAM die. The LPDDR DRAM die may be preferable for mobile electronic applications. Moreover, in these embodiments, the semiconductor die 10 may be operated at clock frequency ranging from 2133 Hz to 4266 Hz.

In some embodiments, the semiconductor die 10 includes two cell regions 10a. The cell regions 10a may be spaced apart from each other. In those embodiments where the semiconductor die 10 is a DRAM die, a DRAM array is formed within each of the cell regions 10a. The DRAM array includes multiple memory cells respectively including an access transistor and a storage capacitor (both not shown) connected to the access transistor. Further, the DRAM array also includes word lines and bit lines. Gate terminals of the access transistors are respectively connected to one of the word lines. Source and drain terminals of each access transistor are connected to one of the bit lines and one of the storage capacitors, respectively. Further, the other terminal of each storage capacitor is coupled to a reference voltage (e.g., a ground voltage).

Referring to FIG. 1A, the semiconductor die 10 further includes an input/output (I/O) region 10b extending between the two cell regions 10a. An I/O circuit (not shown) and bonding pads BP are formed within the I/O region 10b. The I/O circuit and the bonding pads BP are coupled with the cell regions 10a, to enable the cell regions 10a to communicate with external circuits (e.g., a processor). The bonding pads BP are exposed at a surface of the semiconductor die 10, and are configured to be bonded with another semiconductor die or a package component. On the other hand, the I/O circuit is disposed in the semiconductor die 10, and connected to the cell regions 10a and the bonding pads BP. In some embodiments, the I/O region 10b is a linear region extending across a central portion of the semiconductor die 10. In these embodiments, the bonding pads BP within the I/O region 10b may be referred as central pads. As shown in FIG. 1B, the bonding pads BP are separately arranged along a line. The bonding pads BP are configured to transmit different signals. For instance, some of the bonding pads BP are configured to transmit instructions for programming the memory cells in the cell regions 10a or reading data from these memory cells. In addition, some others of the bonding pads BP (annotated as bonding pads BP1) are coupled to a power supply voltage (e.g., the power supply voltage $V_{DD}$ to be described with reference to FIG. 1C), while yet others of the bonding pads BP (annotated as bonding pads BP2) are coupled to a reference voltage (e.g., the reference voltage $V_{SS}$ to be described with reference to FIG. 1C). As an example, more than 30 pairs of the bonding pads BP1 and the bonding pads BP2 are disposed within the I/O region 10b.

In some embodiments, the memory arrays in the cell regions 10a are configured to be operated at high clock frequency. In these embodiments, the fast switched power supply will produce noise at the switching frequency, and such noise may result in power supply oscillation. The power supply oscillation may accidentally cause the amount of charges stored in the storage capacitors to vary, thus may lead to reading errors. A method for preventing such problem may include decoupling the power supply voltage from the noises.

Figure 1C:
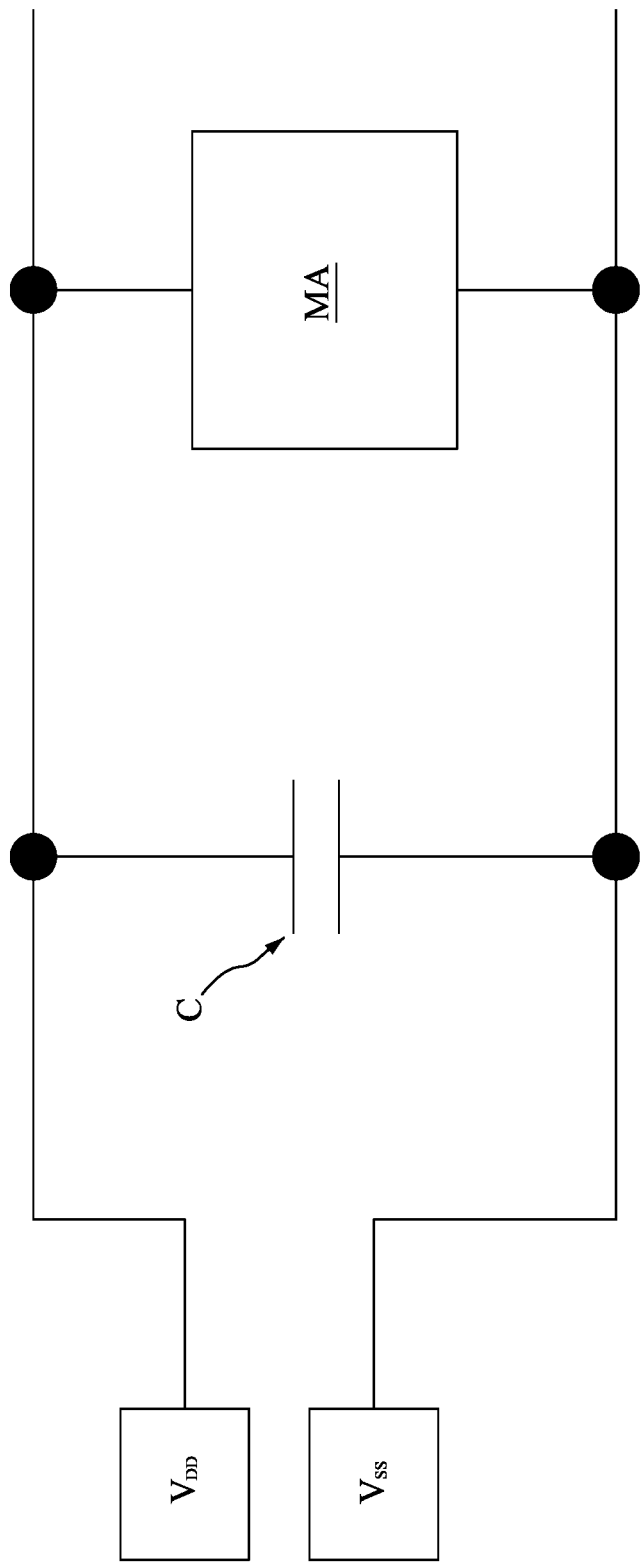
FIG. 1C is a circuit diagram illustrating a power supply decoupling scheme according to some embodiments of the present disclosure.

FIG. 1C is a circuit diagram illustrating a power supply decoupling scheme according to some embodiments of the present disclosure.

Referring to FIG. 1C, in some embodiments, a decoupling capacitor C is placed between a power source and a memory array MA (i.e., the memory array in one of the cell regions 10a as described with reference to FIG. 1A), in order to remove noises from the power supplied to the memory array MA. The power supply may be a DC power supply, and can be represented by a bias voltage between a power supply voltage $V_{DD}$ and a reference voltage $V_{SS}$ (e.g., a ground voltage). The power supply voltage $V_{DD}$ may be coupled to the bonding pads BP1 as described with reference to FIG. 1B, while the reference voltage $V_{SS}$ may be coupled to the bonding pads BP2 as also described with reference to FIG. 1B. The decoupling capacitor C may be in parallel connection with the power source and the memory array MA. If noises are produced along with the power supplied to the memory array MA, charges corresponding to the noises can be stored in the decoupling capacitors C and discharged to ground. Consequently, fluctuation (or referred as oscillation) of the power supply can be effectively reduced. It should be noted that, although only a single decoupling capacitor C is depicted in FIG. 1C, more than two decoupling capacitors C may actually be disposed between the power source and the memory array MA, and these decoupling capacitors C are connected in parallel between the power supply voltage $V_{DD}$ and the reference voltage $V_{SS}$.

Figure 1D:
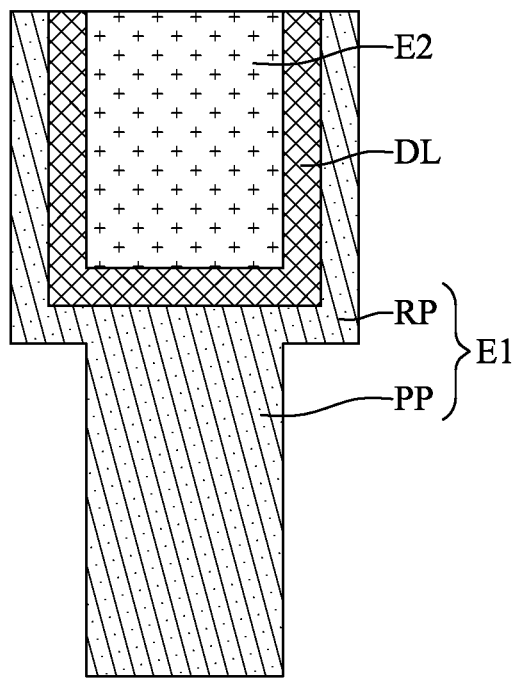
FIG. 1D is a schematic cross-sectional view of a decoupling capacitor according to some embodiments of the present disclosure.
Figure 1E:
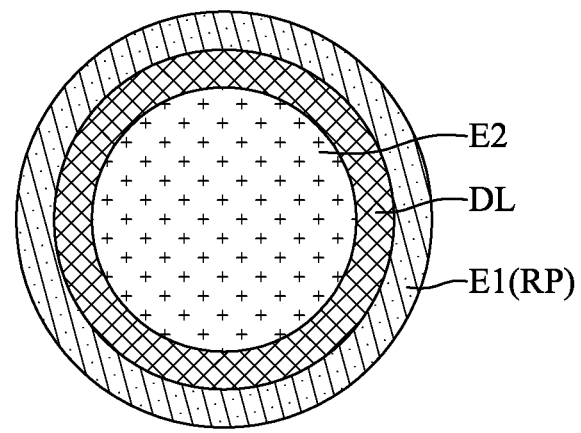
FIG. 1E is a schematic top view of the decoupling capacitor shown in FIG. 1D.

FIG. 1D is a schematic cross-sectional view of the decoupling capacitor C according to some embodiments of the present disclosure. FIG. 1E is a schematic top view of the decoupling capacitor C shown in FIG. 1D.

Referring to FIG. 1D, the decoupling capacitor C is a two-terminal device, and includes a first electrode E1, a second electrode E2 and a capacitor dielectric layer DL spreading between the first and second electrodes E1, E2. The first electrode E1 is one of the terminals of the decoupling capacitor C, while the second electrode E2 is the other terminal of the decoupling capacitor C. The first and second electrodes E1, E2 may be coupled to the power supply voltage $V_{DD}$ and the reference voltage $V_{SS}$ as described with reference to FIG. 1C. In other words, the first and second electrodes E1, E2 are electrically connected to the bonding pads BP1, BP2 as described with reference to FIG. 1B. In some embodiments, the first electrode E1 has a pillar portion PP and a recessed portion RP standing on the pillar portion PP. The recessed portion RP may have a footprint area larger than a footprint area of the pillar portion PP, such that the pillar portion PP could be completely overlapped with the recessed portion RP. In addition, a recess is defined in the recessed portion RP, and the capacitor dielectric layer DL and the second electrode E2 are disposed in such recess. In some embodiments, the capacitor dielectric layer DL conformally covers an inner surface of the recessed portion RP of the first electrode E1. Further, the second electrode E2 covers an inner surface of the capacitor dielectric layer DL, and fills up the recess. The first and second electrodes E1, E2 are made of the same or different conductive material(s), while the capacitor dielectric layer DL is made of a dielectric material. For instance, the conductive material may include polysilicon, titanium, tungsten and aluminum, and the dielectric material may include silicon oxide, aluminum oxide and zirconium oxide.

Referring to FIG. 1D and FIG. 1E, in some embodiments, topmost surfaces of the first electrode E1, the capacitor dielectric layer DL and the second electrode E2 are substantially coplanar, and collectively define a top surface of the decoupling capacitor C. As shown in FIG. 1E, the second electrode E2 is laterally surrounded by the capacitor dielectric layer DL, and the capacitor dielectric layer DL is laterally surrounded by the first electrode E1. Although the decoupling capacitor C is depicted as having a circular top view shape, those skilled in the art may modify the shape of the decoupling capacitor C, the present disclosure is not limited thereto.

Figure 2A:
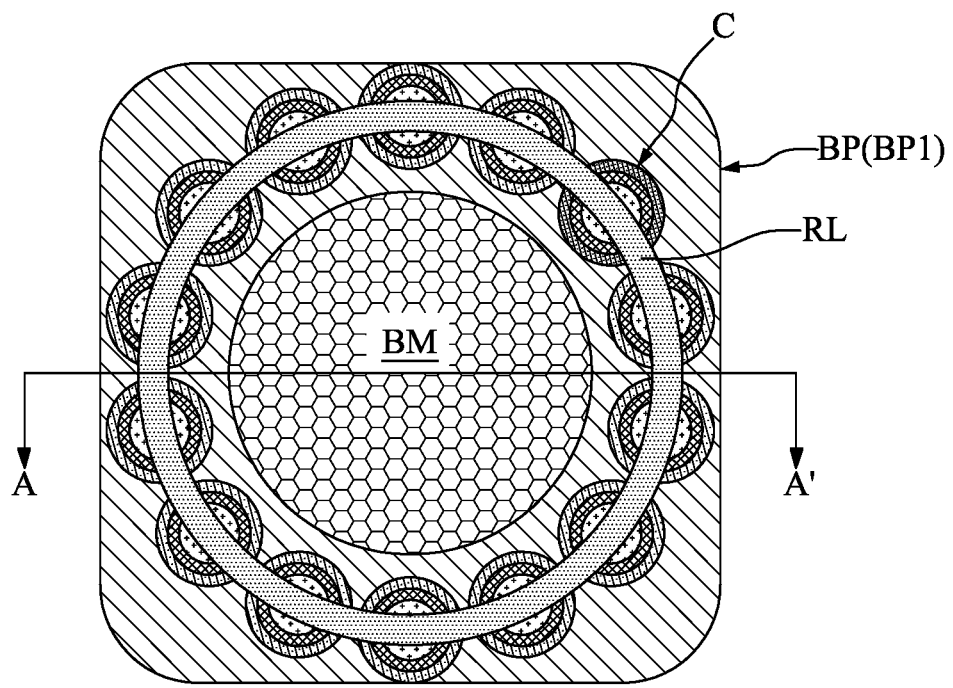
FIG. 2A is a schematic plan view illustrating a bonding pad, an overlying bond metal and underlying decoupling capacitors as well as a routing line according to some embodiments of the present disclosure.
Figure 2B:
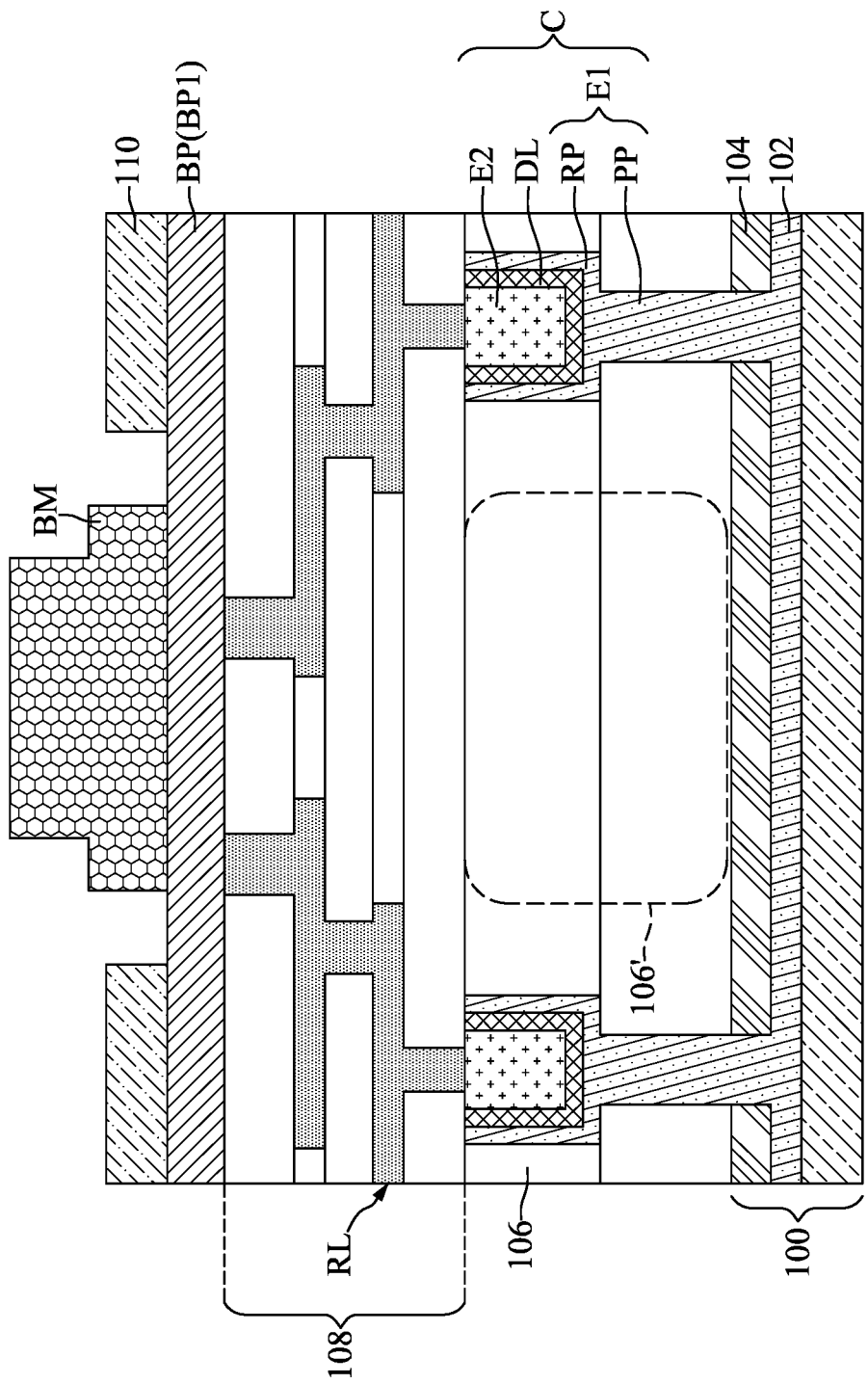
FIG. 2B is a schematic cross-sectional view along line A-A' shown in FIG. 2A.

FIG. 2A is a schematic plan view illustrating a bonding pad, an overlying bond metal and underlying decoupling capacitors as well as a routing line according to some embodiments of the present disclosure. FIG. 2B is a schematic cross-sectional view along line A-A' shown in FIG. 2A.

Referring to FIG. 2A, some decoupling capacitors C are disposed below one of the bonding pads BP1 (i.e., the bonding pads BP that are coupled to the power supply voltage $V_{DD}$). The second electrodes E2 of these decoupling capacitors C are electrically connected to the bonding pad BP1, while the first electrodes E1 of these decoupling capacitors C may be routed to at least one of the bonging pads BP2 (not shown in FIG. 2A). In some embodiments, the second electrodes E2 of these decoupling capacitors C are electrically connected with one another by a routing line RL, and the routing line RL is electrically connected to the bonding pad BP1. In some embodiments, the bonding pad BP1 is electrically connected to another package component (not shown) through a wire bonding process. In these embodiments, a bond metal BM (e.g., a gold ball) is formed on the bonding pad BP1, and a bonding wire (not shown) may be extend to another package component from the bond metal BM. Further, the decoupling capacitors C under the bonding pad BP1 may be located within a region that is not overlapped with the bond metal BM. In some embodiments, these decoupling capacitors C are overlapped with a peripheral region of the bonding pad BP1, whereas the bond metal BM is overlapped with a central region of the bonding pad BP1. In addition, the routing line RL may be formed in a ring shape overlapped with the peripheral region of the bonding pad BP1. During formation of the bond metal BM, a pressure may be applied onto the bonding pad BP1. If the decoupling capacitors C were disposed within a region overlapped with the bond metal BM, the decoupling capacitors C would be damaged by such pressure, and may be determined as failed during a testing process. Alternatively, such damage may not be identified during the testing process, but result in compromise of reliability of the semiconductor die. Therefore, by disposing the decoupling capacitors C within the region not overlapped with the bond metal BM according to embodiments of the present disclosure, the damage on the decoupling capacitors C caused during formation of the bond metal BM can be effectively avoided.

Referring to FIG. 2B, the semiconductor die 10 includes a substrate 100, and the decoupling capacitors C, the bonding pad BP1 and the bond metal BM are formed over the substrate 100. The substrate 100 may be a semiconductor substrate or a semiconductor-on-insulator (SOI) substrate. In some embodiments, the semiconductor die 10 further includes a routing line 102 buried in the substrate 100. The routing line 102 is electrically connected to the first electrodes E1 of the decoupling capacitors C, and the first electrodes E1 are routed to one or more of the bonding pads BP2 that are coupled to the reference voltage $V_{SS}$ (as described with reference to FIG. 1B and FIG. 1C) through the routing line 102. It should be noted that, for conciseness, the routing line 102 is omitted from illustration in FIG. 2A. In some embodiments, the routing line 102 is formed in a bottom portion of a recess at a surface of the substrate 100. Further, an insulating structure 104 is formed on the routing line 102, and fills up the recess. In addition, the pillar portions PP of the first electrodes E1 of the decoupling capacitors C may penetrate through the insulating structure 104, to establish electrical connection with the routing line 102. In some embodiments, the routing line 102, which spreads within the I/O region 10b as described with reference to FIG. 1A, and word lines (not shown) in the memory arrays within the cell regions 10a (also described with reference to FIG. 1A) are simultaneously formed. Alternatively, the routing line 102 and the word lines may be formed during different process steps. The routing line 102 is made of a conductive material, such as Cu, Ti, TiN, Ta, TaN, W, the like or combinations thereof. On the other hand, the insulating structure 104 is made of an insulating material, such as silicon oxide, silicon nitride, silicon oxynitride or combinations thereof.

In some embodiments, the semiconductor die 100 further includes a stack of dielectric layers 106. The decoupling capacitors C are located in the stack of dielectric layers 106, whereas the bonding pad BP1 and the bond metal BM lie on the stack of dielectric layers 106. For instance, the decoupling capacitors C may be formed in bottommost ones of the dielectric layers 106 (e.g., bottommost two of the dielectric layers 106), and may extend through the insulating structure 104 to reach the routing line 102. The pillar portions PP of the first electrodes E1 of the decoupling capacitors C may penetrate through one of the dielectric layers 106 (e.g., the bottommost dielectric layer 106), and the recessed portions RP of the first electrodes E1, the dielectric layers DL and the second electrodes E2 are formed in another one of the dielectric layers 106 lying above the pillar portions PP of the first electrodes E1. As described with reference to FIG. 2A, the decoupling capacitors C are not overlapped with a region in which the bond metal BM is formed, in order to prevent damages on the decoupling capacitors C during formation of the bond metal BM. As shown in FIG. 2B, a portion 106' of the dielectric layers 106 is overlapped with the bond metal BM, and such portion 106' of the dielectric layers 106 is laterally surrounded by the decoupling capacitors C. In some embodiments, the dielectric layers 106 include one or more dielectric material(s), such as silicon oxide, silicon nitride, silicon oxynitride, the like or combinations thereof.

In some embodiments, the semiconductor die 10 further includes routing elements 108. The routing elements 108 are formed in the stack of dielectric layers 106, and are configured to rout the decoupling capacitors C to the bonding pads BP (including the bonding pad BP1 shown in FIG. 2B), and to transmit signals to/from the memory arrays in the cell regions 10a as described with reference to FIG. 1A. As shown in FIG. 2B, a portion of the routing elements 108 are formed over the decoupling capacitors C, and are configured to rout the second electrodes E2 of the decoupling capacitors C to the bonding pad BP1. The routing elements 108 include conductive traces and conductive vias. The conductive traces respectively lie on one of the dielectric layers 106, whereas the conductive vias respectively penetrate through one or more of the dielectric layers 106 and electrically connect to at least one of the conductive traces. The routing line RL as described with reference to FIG. 2A may be one of the conductive traces of the routing elements 108. In some embodiments, as similar to the decoupling capacitors C, the routing line RL is overlapped with the peripheral region of the bonding pad BP1, whereas the bond metal BM is overlapped with the central region of the bonding pad BP1. Alternatively, the routing line RL may be at least partially overlapped with the bond metal BM. The routing elements 108 may be formed of one or more conductive material(s), such as Cu, Ti, TiN, Ta, TaN, W, Al, the like or combinations thereof.

In some embodiments, a polymer pattern 110 is further formed on the stack of dielectric layers 106. In these embodiments, the polymer pattern 110 may cover the bonding pad BP1, and may have an opening in which the bond metal BM is disposed. In other words, a location of the bond metal BM can be defined in the opening of the polymer pattern 110. The polymer pattern 110 is formed of a polymer material, such as polyimide.

Figure 3A:
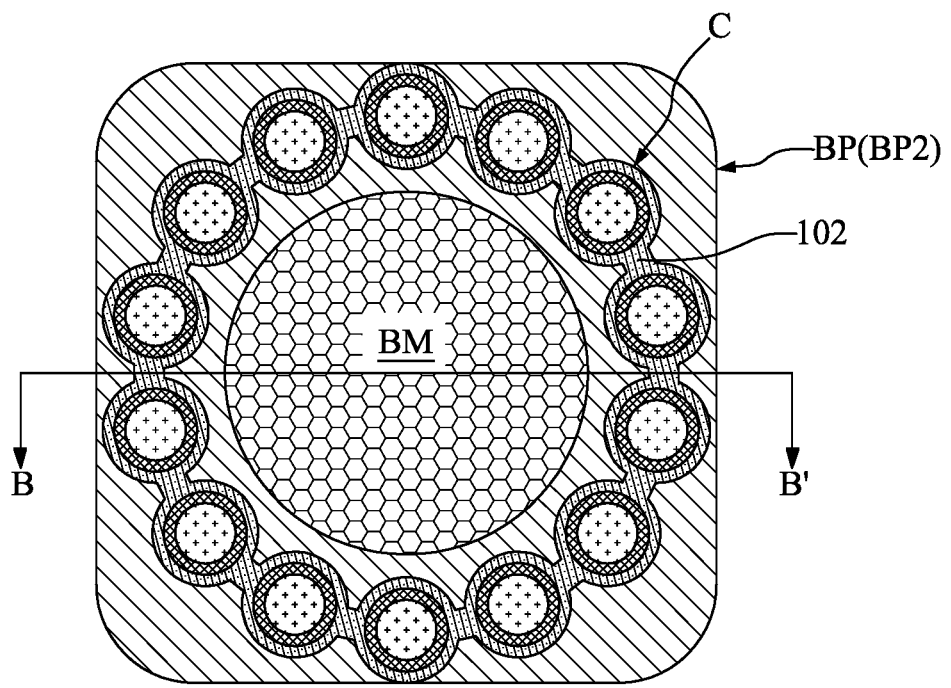
FIG. 3A is a schematic plan view illustrating another bonding pad, an overlying bond metal and underlying decoupling capacitors as well as a routing line according to some embodiments of the present disclosure.
Figure 3B:
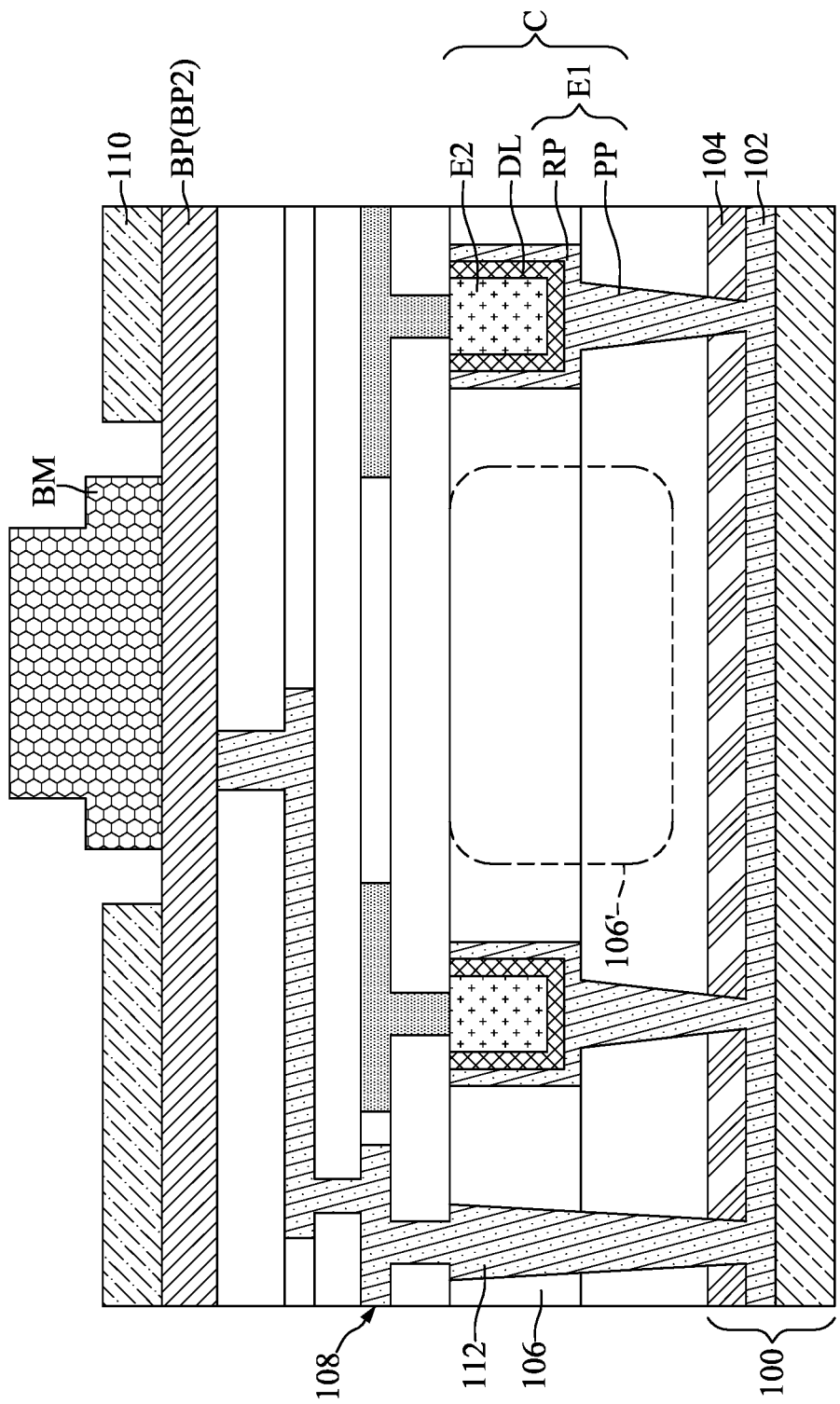
FIG. 3B is a schematic cross-sectional view along line B-B' shown in FIG. 3A.

FIG. 3A is a schematic plan view illustrating a bonding pad BP2, an overlying bond metal BM and underlying decoupling capacitors C as well as a routing line 102 according to some embodiments of the present disclosure. FIG. 3B is a schematic cross-sectional view along line B-B' shown in FIG. 3A. The portion of the semiconductor die 10 shown in FIG. 3A and FIG. 3B is similar to the portion of the semiconductor die 10 as described with reference to FIG. 2A and FIG. 2B. Only differences therebetween will be described, the same or the like parts would not be repeated again.

Referring to FIG. 3A and FIG. 3B, some decoupling capacitors C are disposed below one of the bonding pads BP2 (i.e., the bonding pads BP that are coupled to the reference voltage $V_{SS}$). The first electrodes E1 of these decoupling capacitors C are electrically connected to the overlying bonding pad BP2, while the second electrodes E2 of these decoupling capacitors C may be routed to at least one of the bonding pads BP2 (not shown in FIG. 3A and FIG. 3B). In some embodiments, the first electrodes E1 are electrically connected with one another by the routing line 102 buried in the substrate 100, and the routing line 102 is electrically connected to the overlying bonding pad BP2 through some portions of the routing elements 108. In these embodiments, the routing elements 108 may further include a conductive plug 112 for providing a vertical conductive path extending from the portion of the routing elements 108 above the decoupling capacitors C to the routing line 102 in the substrate 100. For instance, the conductive plug 112 may penetrate through bottommost ones of the dielectric layers 106 as well as the insulating structure 104, and may be located aside the decoupling capacitors C. Further, as similar to the routing line RL described with reference to FIG. 2A, the routing line 102 shown in FIG. 3A may also be formed in a ring shape, and overlapped with a peripheral region of the bonding pad BP2.

In some embodiments, an area of the bonding pad BP1/BP2 is about 3600 $\mu m^2$, and a footprint area of each decoupling capacitors C is about 120 $nm^2$. In these embodiments, tens of thousands of the decoupling capacitors C can be placed under each of the bonding pads BP1/BP2. If a capacitance of each decoupling capacitor C is about 15 fF, an equivalent capacitance of the decoupling capacitors C under each bonding pad BP1/BP2 may range from about 100 pF to about 450 pF. However, those skilled in the art may adjust the dimensions of the bonding pads BP and the decoupling capacitors C according to design requirements, the present disclosure is not limited thereto.

As described above, the semiconductor die 10 according to embodiments of the present disclosure includes the decoupling capacitors C, for reducing fluctuation of the power supplied to the memory arrays. The decoupling capacitors C are disposed below the bonding pads BP that are coupled to the power supply voltage $V_{DD}$ and the reference voltage $V_{SS}$ (i.e., the bonding pads BP1, BP2). Further, the decoupling capacitors C disposed below the bonding pads BP1, BP2 are overlapped with peripheral regions of the bonding pads BP1, BP2, while the bond metals BM formed on the bonding pad BP1, BP2 for a bonding process are overlapped with central regions of the bonding pads BP1, BP2. As a result, the decoupling capacitors C can be avoided from being damaged by the pressure applied on the bonding pads BP1, BP2 during formation of the bond metals BM. Therefore, a power stabilization ability of the decoupling capacitors C can be less affected by the bonding process. Consequently, yield and reliability of the semiconductor die 10 can be improved.

Figure 4:
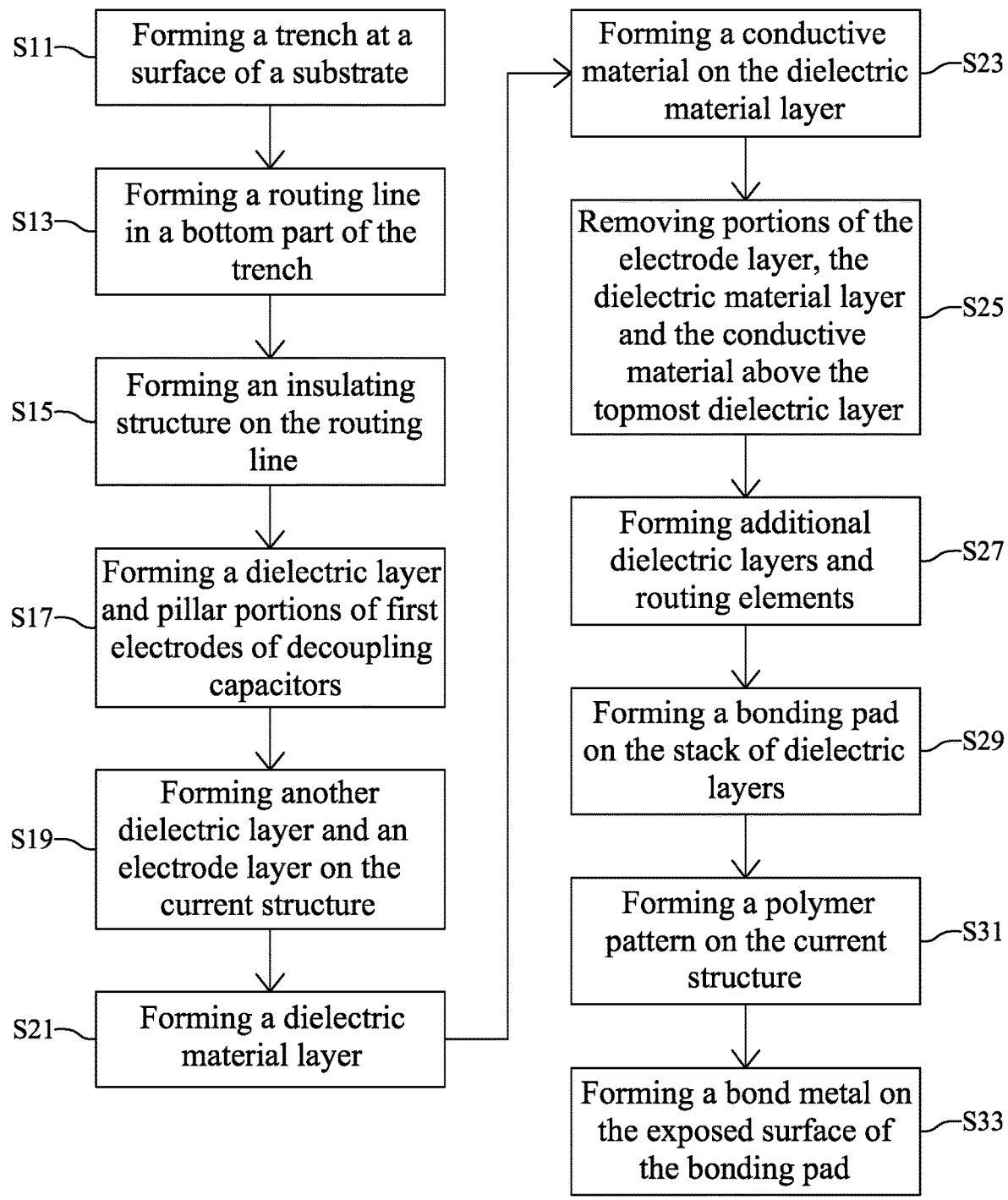
FIG. 4 is a flow diagram illustrating a manufacturing method of a portion of the semiconductor die as shown in FIG. 2B according to some embodiments of the present disclosure.

FIG. 4 is a flow diagram illustrating a manufacturing method of a portion of the semiconductor die 10 as shown in FIG. 2B according to some embodiments of the present disclosure. FIG. 5A through FIG. 5K are schematic cross-sectional views illustrating structures at various stages during the manufacturing process shown in FIG. 4.

Figure 5A:
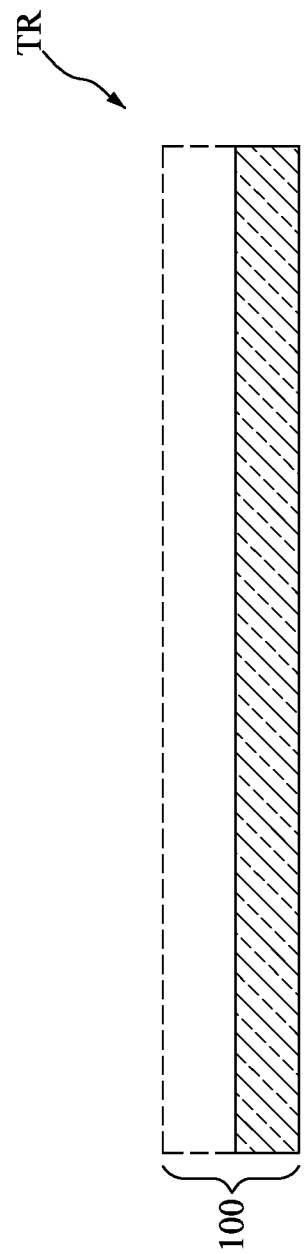
FIG. 5A through FIG. 5K are schematic cross-sectional views illustrating structures at various stages during the manufacturing process shown in FIG. 4.

Referring to FIG. 4 and FIG. 5A, step S11 is performed, and a trench TR is formed at a surface of the substrate 100. The dash lines depicted in FIG. 5A indicate a removed portion of the substrate 100, which is where the trench TR lies. In some embodiments, a method for forming the trench TR includes a lithography process and an etching process. The etching process is such as an anisotropic etching process.

Figure 5B:
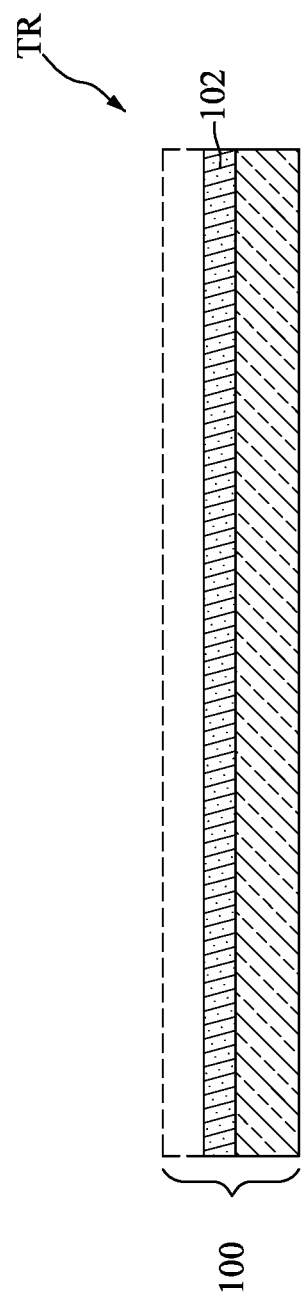

Referring to FIG. 4 and FIG. 5B, step S13 is performed, and the routing line 102 is formed in a bottom part of the trench TR. A top surface of the routing line 102 is lower than a topmost end of the trench TR (i.e., the surface of the substrate 100). In some embodiments, a method for forming the routing line 102 includes filling a conductive material into the trench TR. The conductive material may fill up the trench TR, and may or may not further extend onto the surface of the substrate 100. Subsequently, an upper portion of the conductive material is removed, such that the remained portion of the conductive material forms the routing line 102. For instance, a method for removing the upper portion of the conductive material may include an etching process (e.g., an isotropic etching process), or may include a polishing process (e.g., a chemical mechanical polishing (CMP) process) and the etching process.

Figure 5C:
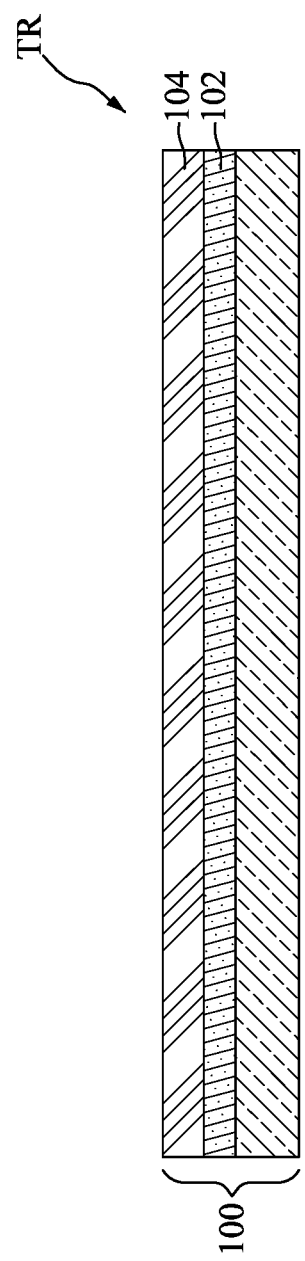

Referring to FIG. 4 and FIG. 5C, step S15 is performed, and the insulating structure 104 is formed on the routing line 102. The insulating structure 104 may fill up the trench TR, and a top surface of the insulating structure 104 may be substantially coplanar with the surface of the substrate 100. Alternatively, the top surface of the insulating structure 104 may be slightly lower than the top surface of the substrate 100. In some embodiments, a method for forming the insulating structure 104 includes filling an insulating material into an upper portion of the trench TR by a deposition process (e.g., a chemical vapor deposition (CVD) process). The insulating material may fill up the trench TR, and may or may not further extend onto the surface of the substrate 100. Subsequently, a portion of the insulating material above the surface of the substrate 100 may be removed by a planarization process, and the remained portion of the insulating material forms the insulating structure 104. For instance, the planarization process may include a polishing process (e.g., a CMP process), and etching process (e.g., an isotropic etching process) or a combination thereof.

Figure 5D:
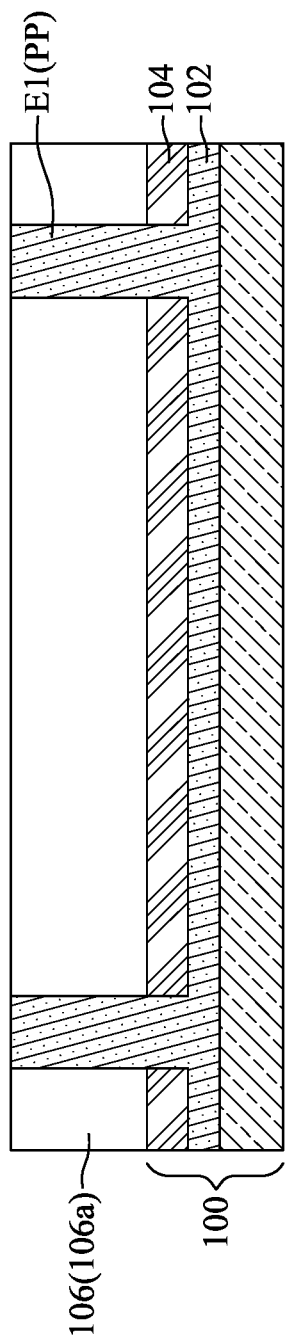

Referring to FIG. 4 and FIG. 5D, step S17 is performed, and one of the dielectric layers 106 (hereinafter referred as a dielectric layer 106a) and the pillar portions PP of the first electrodes E1 of the decoupling capacitors C are formed. The pillar portions PP of the first electrodes E1 may penetrate through the dielectric layer 106a and the insulating structure 104, to establish electrical connection with the routing line 102. In some embodiments, the dielectric layer 106a is formed by a deposition process (e.g., a CVD process). Thereafter, through holes may be formed to penetrate through the dielectric layer 106a and the insulating structure 104 by a lithography process and an etching process (e.g., an anisotropic etching process). Subsequently, a conductive material is filled into these through holes by a deposition process (e.g., a physical vapor deposition (PVD) process), a plating process or a combination thereof. In addition, a planarization process (e.g., a polishing process, an etching process or a combination thereof) may be further performed to remove portions of the conductive material above a top surface of the dielectric layers 106a. The remained portions of the conductive material may form the pillar portions PP of the first electrodes E1.

Figure 5E:
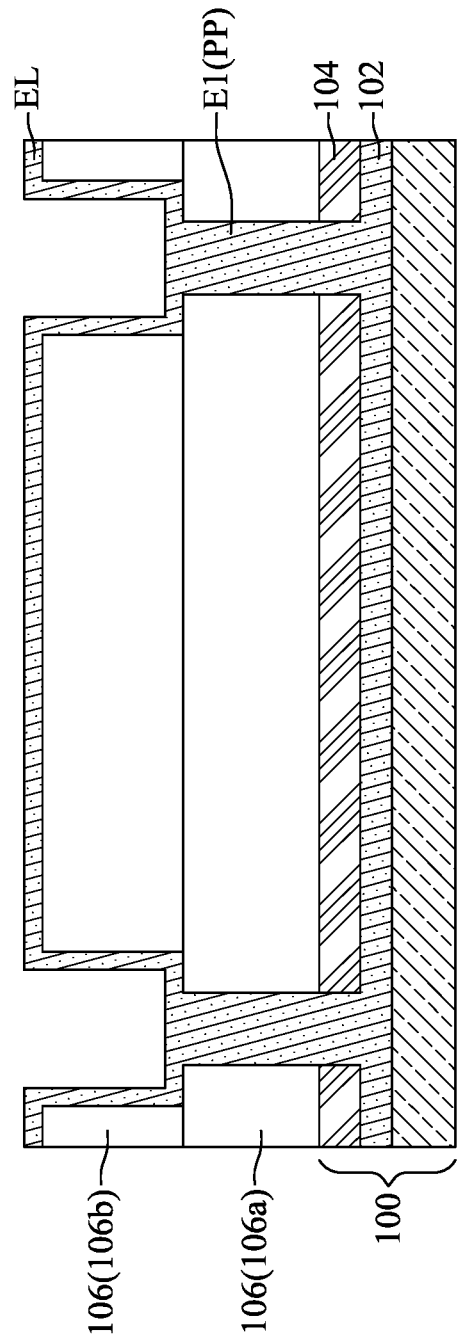

Referring to FIG. 4 and FIG. 5E, step S19 is performed, and another one of the dielectric layers 106 (hereinafter referred as a dielectric layer 106b) and an electrode layer EL are formed on the current structure. The dielectric layer 106b has openings overlapped with the pillar portions PP of the first electrodes E1. These openings of the dielectric layer 106b may respectively have a footprint area larger than a footprint area of each pillar portion PP of the first electrodes E1. The electrode layer EL may conformally cover exposed surfaces of the dielectric layer 106b, the dielectric layer 106a and the pillar portions PP of the first electrodes E1. Accordingly, the electrode layer EL is recessed in corresponding to the openings of the dielectric layer 106b. In some embodiments, a method for forming the dielectric layer 106b includes a deposition process, such as a CVD process. In addition, a method for forming the electrode layer EL may include a deposition process (e.g., a CVD process or a PVD process), a plating process or a combination thereof.

Figure 5F:
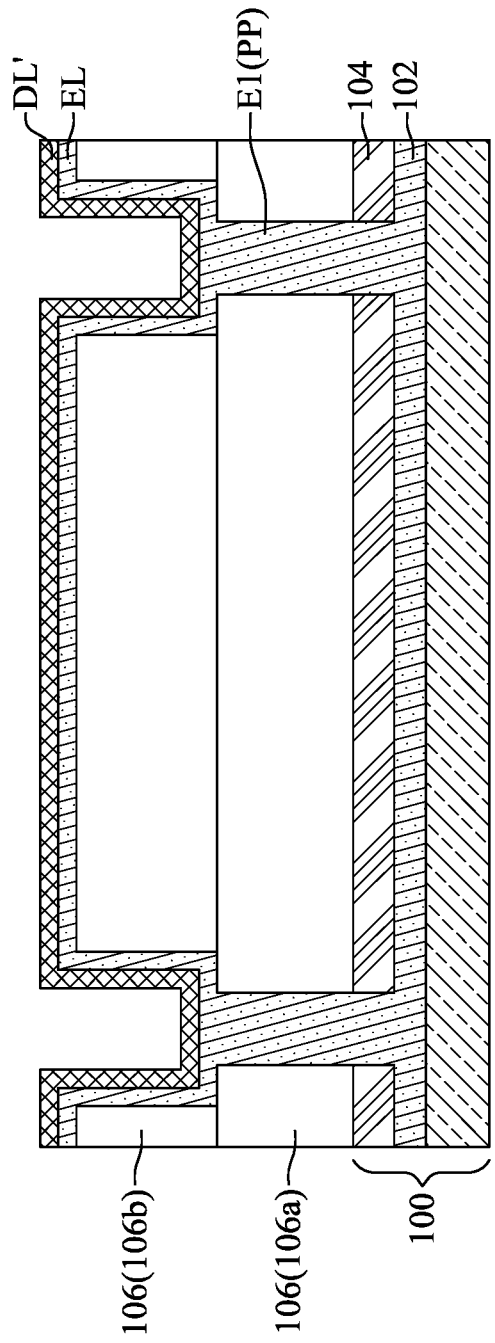

Referring to FIG. 4 and FIG. 5F, step S21 is performed, and a dielectric material layer DL' is formed. The dielectric material layer DL' conformally covers the electrode layer EL. Accordingly, the dielectric material layer DL' may be recessed in corresponding to the recess of the electrode layer EL. In some embodiments, a method for forming the dielectric material layer DL' includes a deposition process, such as a CVD process.

Figure 5G:
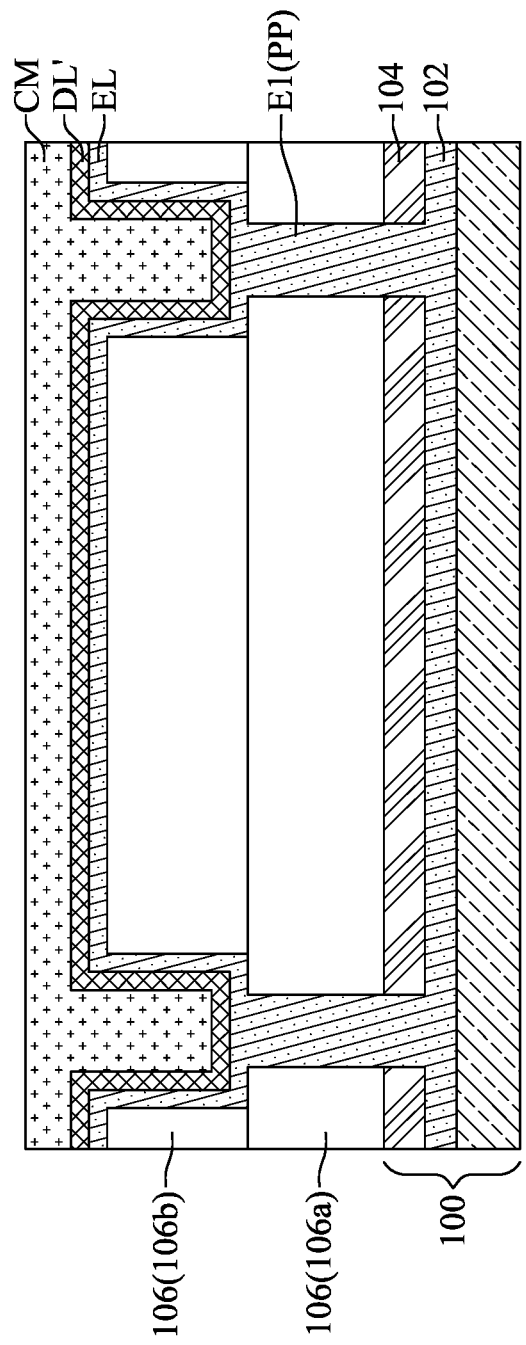

Referring to FIG. 4 and FIG. 5G, step S23 is performed, and a conductive material CM is formed on the dielectric material layer DL'. The conductive material CM may fill up the recesses defined by the dielectric material layer DL', and cover a topmost surface of the dielectric material layer DL'. In some embodiments, a method for forming the conductive material CM includes a deposition process (e.g., a CVD process or a PVD process), a plating process and a combination thereof.

Figure 5H:
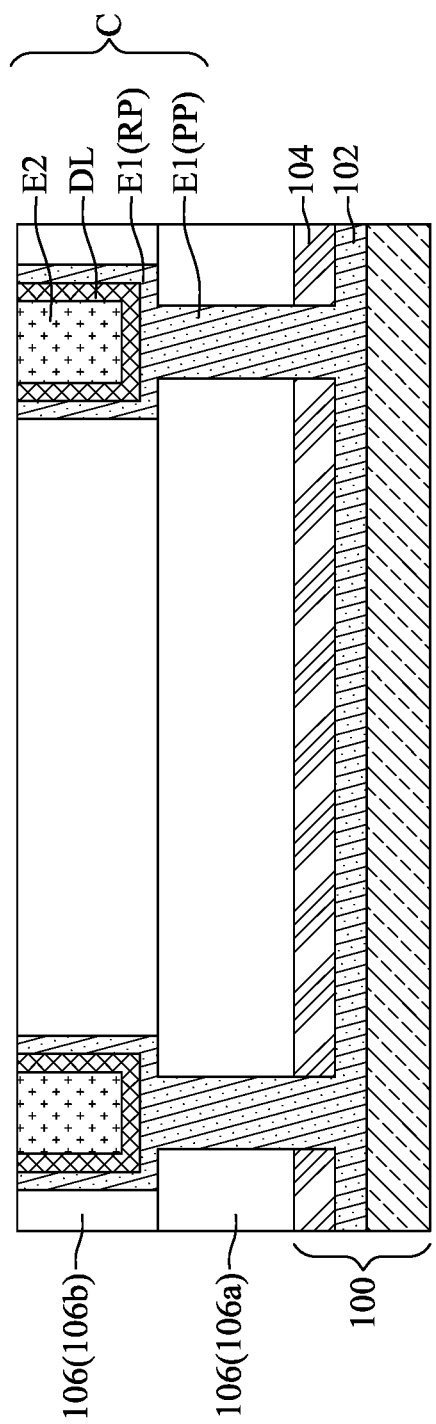

Referring to FIG. 4 and FIG. 5H, step S25 is performed, and portions of the electrode layer EL, the dielectric material layer DL' and the conductive material CM above the top surface of the dielectric layer 106b are removed. As a result, portions of the electrode layer EL, the dielectric material layer DL' and the conductive material CM in the openings of the dielectric layer 106b are remained. The remained portions of the electrode layer EL form the recessed portions RP of the first electrodes E1. The remained portions of the dielectric material layer DL' form the dielectric layers DL. The remained portions of the conductive material CM form the second electrodes E2. Up to here, the decoupling capacitors C have been formed according to some embodiments. In some embodiments, a method for patterning the electrode layer EL, the dielectric material layer DL' and the conductive material CM includes a planarization process. For instance, the planarization process may include a polishing process, an etching process or a combination thereof.

Figure 5I:
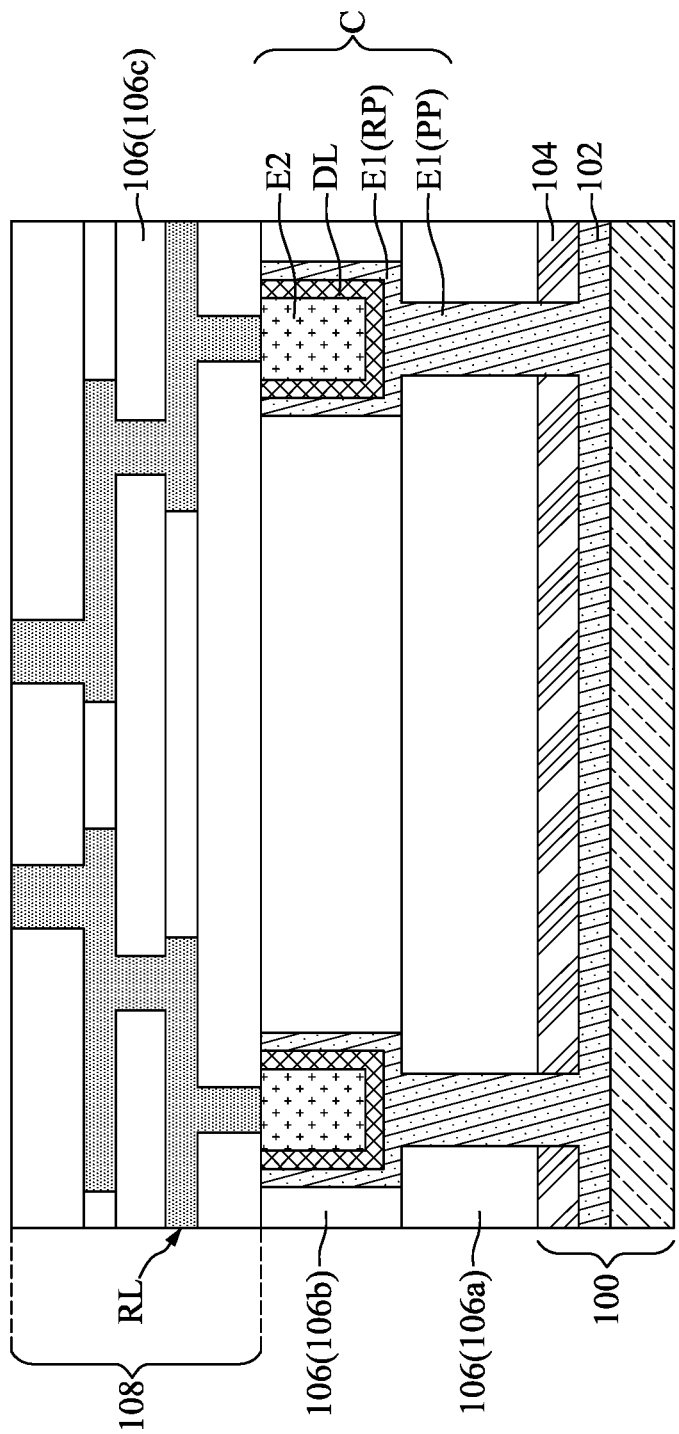

Referring to FIG. 4 and FIG. 5I, step S27 is performed, and more of the dielectric layers 106 (hereinafter referred as dielectric layers 106c) and the routing elements 108 are formed. In some embodiments, a method for forming the dielectric layers 106c and the routing elements 108 includes performing a damascene process multiple times. Each damascene process may include deposition of one or more of the dielectric layers 106c, forming vias and/or trenches in the dielectric layer(s) 106c, forming a conductive material to fill up the vias and/or trenches, and removing portions of the conductive material above the dielectric layer(s) 106c.

Figure 5J:
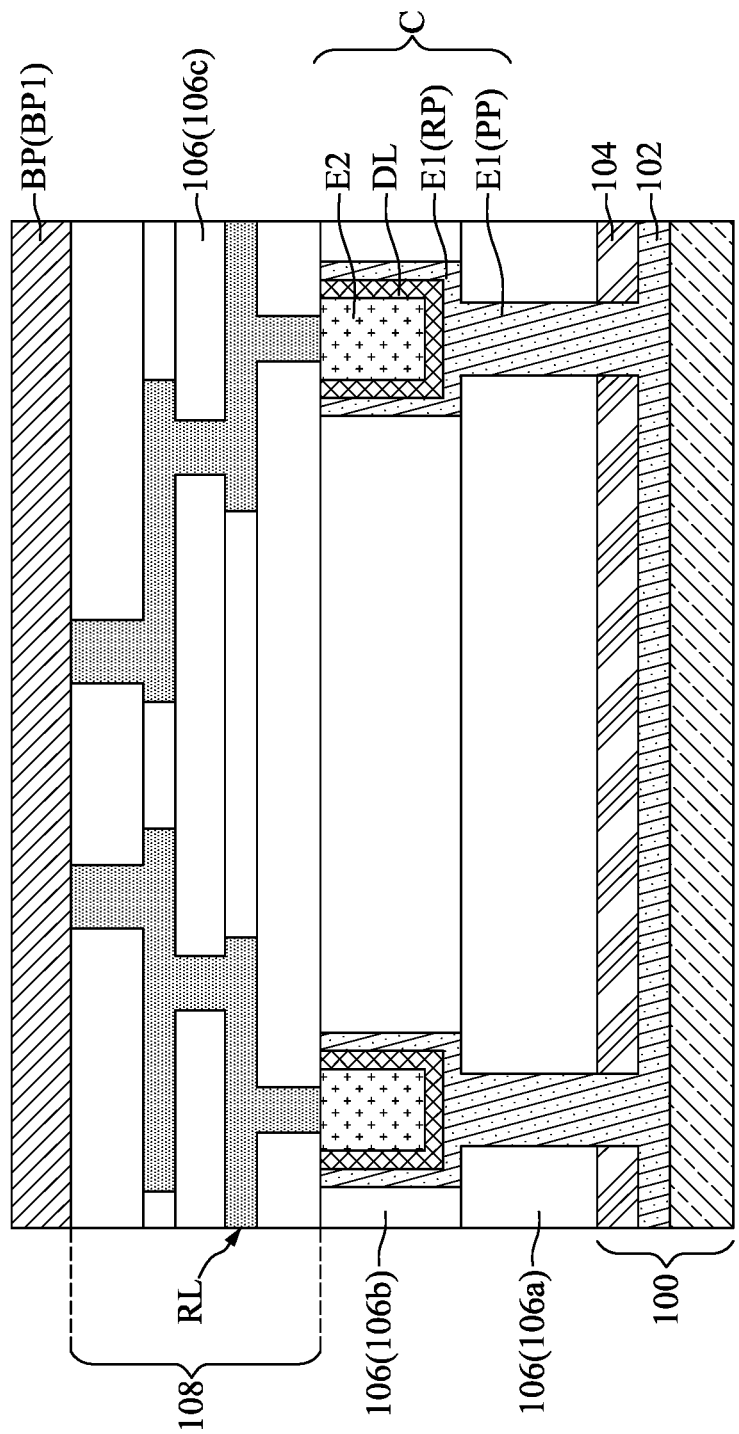

Referring to FIG. 4 and FIG. 5J, step S29 is performed, and the bonding pad BP1 is formed on the stack of dielectric layers 106. The bonding pad BP1 is electrically connected to the topmost ones of the routing elements 108 in the stack of dielectric layers 106. In some embodiments, a method for forming the bonding pad BP1 includes globally forming a conductive layer on the dielectric layers 106 by a deposition process, a plating process or a combination thereof, and then patterning the conductive layer to form the bonding pad BP1 by a lithography process and an etching process. In alternative embodiments, the bonding pad BP1 may be formed by a damascene process, and an additional dielectric layer (not shown) laterally surrounds the bonding pad BP1.

Figure 5K:
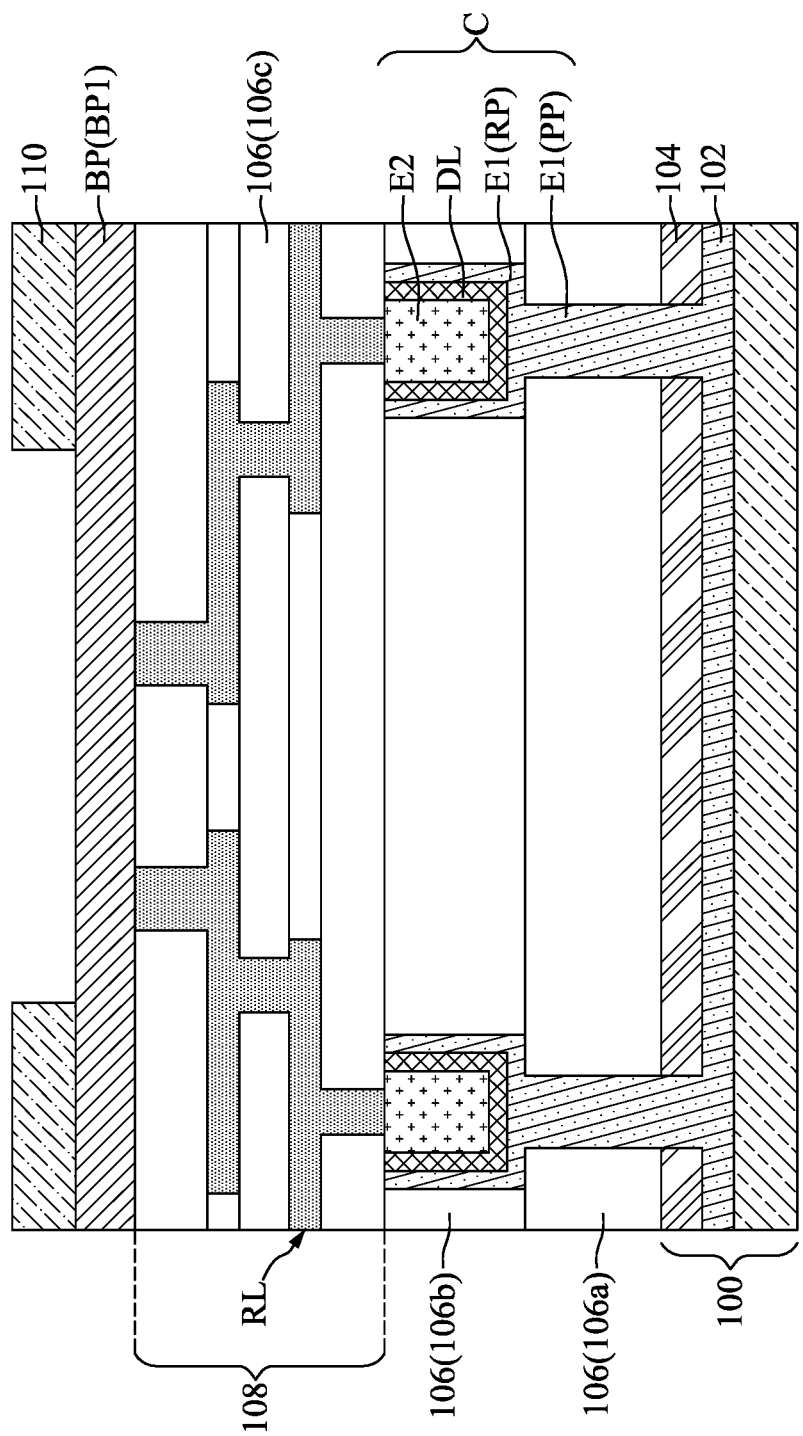

Referring to FIG. 4 and FIG. 5K, step S31 is performed, and the polymer pattern 110 is formed on the current structure. The polymer pattern 110 has an opening overlapped with a portion of the bonding pad BP1. In some embodiments, the polymer pattern 110 is formed of a photosensitive material. In these embodiments, a method for forming the polymer pattern 110 includes globally forming a polymer layer, and patterning the polymer layer using a photolithography process. The remained portion of the polymer layer forms the polymer pattern 110. In alternative embodiments, the material of the polymer pattern 110 is not photosensitive. In these alternative embodiments, the globally formed polymer layer is patterned by a lithography process and an etching process, to form the polymer pattern 110.

Referring to FIG. 4 and FIG. 2B, step S33 is performed, and the bond metal BM is formed on the exposed surface of the bonding pad BP1. In those embodiments where the bond metal BM is disposed for a wire bonding process, the bond metal BM may be a metal ball, and may be formed by melting an end portion of a metal wire (e.g., gold wire) held by a bonding tool (referred as capillary) through electronic flame-off (EFO). Subsequently, the molten portion is brought in contact with the bonding pad BP1, so as to form the bond metal BM. Subsequently, the bonding tool may be lifted up and moved to form a bonding wire (not shown).

Up to here, the portion of the semiconductor die 10 shown in FIG. 2B has been formed. According to some embodiments, another portion of the semiconductor die 10 shown in FIG. 3B can be formed by a similar method described with reference to FIG. 4 and FIG. 5A through FIG. 5K, except that the conductive plug 112 is further formed in the stack of dielectric layers 106. In some embodiments, the conductive plug 112 is formed after the formation of the decoupling capacitors C (as described with reference to FIG. 5H) and before the formation of the dielectric layers 106c and the routing elements 108 (as described with reference to FIG. 5I). In these embodiments, a through hole may be formed in the dielectric layers 106a, 106b by a lithography process and an etching process (e.g., an anisotropic etching process), and a conductive material is filled in this through hole by a deposition process (e.g., a PVD process), a plating process or a combination thereof. Subsequently, portions of the conductive material above the dielectric layer 106b is removed by a planarization process (e.g., a polishing process, an etching process or a combination thereof), and the remained portion of the conductive material forms the conductive plug 112.

As above, the method of embodiments of the present disclosure includes a memory array, and further includes decoupling capacitors connected in parallel with the memory array, for reducing fluctuation of the power supplied to the memory array. The decoupling capacitors are disposed below bonding pads that are coupled to a power supply voltage and bonding pads that are coupled to a reference voltage. Further, the decoupling capacitors disposed below the bonding pads are overlapped with peripheral regions of the bonding pads. On the other hand, bond metals formed on the bonding pads are overlapped with central regions of the bonding pads. As a result, the decoupling capacitors can be avoided from being damaged by a possible pressure applied on the bonding pads during formation of the bond metals. Therefore, a power stabilization ability of the decoupling capacitors can be less affected by the bonding process. Consequently, yield and reliability of the semiconductor die can be improved.

In an aspect of the present disclosure, a semiconductor die is provided. The semiconductor die comprises: a memory array, disposed within a cell region of the semiconductor die; first and second bonding pads, disposed within an input/output (I/O) region of the semiconductor die, wherein the first bonding pads are coupled to a power supply voltage, and the second bonding pads are coupled to a reference voltage; decoupling capacitors, disposed under the first and second bonding pads, and connected in parallel between the first bonding pads and the second bonding pads; and bond metals, disposed on the first and second bonding pads, respectively, wherein the decoupling capacitors are overlapped with the first and second bonding pads, and are located outside portions of the semiconductor die that are overlapped with the bond metals.

In another aspect of the present disclosure, a semiconductor die is provided. The semiconductor die comprises: dielectric layers, stacked on a substrate; decoupling capacitors, formed in the dielectric layers; first and second bonding pads, disposed on the dielectric layers, wherein the first bonding pads are coupled to a power supply voltage, the second bonding pads are coupled to a reference voltage, a group of the decoupling capacitors are located under one of the first bonding pads, first terminals of the group of the decoupling capacitors are electrically connected to the one of the first bonding pads, second terminals of the group of the decoupling capacitors are routed to one of the second bonding pads; and bond metals, disposed on the first and second bonding pads, wherein the decoupling capacitors are overlapped with the first and second bonding pads, and laterally surround portions of the dielectric layers overlapped with the bond metals.

In yet another aspect of the present disclosure, a semiconductor die is provided. The semiconductor die comprises: first and second bonding pads, wherein the first bonding pads are coupled to a power supply voltage, and the second bonding pads are coupled to a reference voltage; bond metals, disposed on central portions of the first and second bonding pads, respectively; and decoupling capacitors, disposed under the first and second bonding pads, and overlapped with peripheral portions of the first and second bonding pads, wherein the decoupling capacitors are in parallel connection with one another, first terminals of the decoupling capacitors are electrically connected to the first bonding pads, and second terminals of the decoupling capacitors are electrically connected to the second bonding pads.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A method for manufacturing semiconductor die, comprising:
   forming dielectric layers on a substrate;
   forming decoupling capacitors in the dielectric layers;
   forming first and second bonding pads on the dielectric layers, wherein the first bonding pads are coupled to a power supply voltage, the second bonding pads are coupled to a reference voltage, a group of the decoupling capacitors are located under one of the first bonding pads, first terminals of the group of the decoupling capacitors are electrically connected to the one of the first bonding pads, second terminals of the group of the decoupling capacitors are routed to one of the second bonding pads; and
   forming bond metals on the first and second bonding pads, wherein the decoupling capacitors are overlapped with the first and second bonding pads, and laterally surround portions of the dielectric layers overlapped with the bond metals.

2. The method of claim 1, wherein forming the decoupling capacitors respectively comprise:
   forming a first electrode having a pillar portion and a recessed portion on the pillar portion, and functioned as the second terminal of the decoupling capacitor;
   forming a capacitor dielectric layer conformally covering an inner surface of the recessed portion of the first electrode; and
   forming a second electrode covering the capacitor dielectric layer and filling up a recess defined in the recessed portion of the first electrode, wherein the second electrode is functioned as the first terminal of the decoupling capacitor.

3. The method of 2, further comprising: forming routing elements in the dielectric layers, wherein the first and second electrodes of the decoupling capacitors are routed to the second and first bonding pads through the routing elements.

4. The method of claim 3, wherein forming the routing elements comprise forming a first routing line extending over the group of the decoupling capacitors, and the second electrodes of the group of the decoupling capacitors are electrically connected together by the routing line.

5. The method of claim 3, further comprising: forming a second routing line in the substrate, wherein the first electrodes of the group of the decoupling capacitors are electrically connected to the second routing line.

6. The method of claim 5, wherein forming the routing elements further comprise forming a conductive plug standing on the second routing line, wherein the second routing line is routed to the one of the second bonding pads through the conductive plug.

7. The method of claim 1, further comprising: forming a polymer pattern covering the first and second bonding pads, and having openings respectively exposing a portion of one of the first and second bonding pads.

8. A method of manufacturing a semiconductor die, comprising:
   forming first and second bonding pads, wherein the first bonding pads are coupled to a power supply voltage, and the second bonding pads are coupled to a reference voltage;
   forming bond metals on central portions of the first and second bonding pads, respectively; and
   forming decoupling capacitors under the first and second bonding pads, and overlapped with peripheral portions of the first and second bonding pads, wherein the decoupling capacitors are in parallel connection with one another, first terminals of the decoupling capacitors are electrically connected to the first bonding pads, and second terminals of the decoupling capacitors are electrically connected to the second bonding pads, wherein more than one of the decoupling capacitors are overlapped each one of the first and second bonding pads, wherein the decoupling capacitors overlapped with each of the first and second bonding pads are separately arranged along an annulus pattern.

9. The method of claim 8, further comprising: forming a memory array connected in parallel with the decoupling capacitors.

* * * * *